United States Patent
Ishida et al.

(10) Patent No.: US 7,903,776 B2
(45) Date of Patent: Mar. 8, 2011

(54) JITTER MEASUREMENT APPARATUS, JITTER CALCULATOR, JITTER MEASUREMENT METHOD, PROGRAM, RECORDING MEDIUM, COMMUNICATION SYSTEM AND TEST APPARATUS

(75) Inventors: Masahiro Ishida, Tokyo (JP); Kiyotaka Ichiyama, Tokyo (JP); Takahiro Yamaguchi, Tokyo (JP)

(73) Assignee: Advantest Corporation, Tokyo (JP)

( * ) Notice: Subject to any disclaimer, the term of this patent is extended or adjusted under 35 U.S.C. 154(b) by 68 days.

(21) Appl. No.: 12/414,618

(22) Filed: Mar. 30, 2009

(65) Prior Publication Data

US 2010/0080274 A1  Apr. 1, 2010

Related U.S. Application Data

(63) Continuation-in-part of application No. 12/116,970, filed on May 8, 2008, and a continuation-in-part of application No. 11/535,279, filed on Sep. 26, 2006, now Pat. No. 7,715,512.

(51) Int. Cl.
  *H04L 7/00* (2006.01)
  *H04L 25/00* (2006.01)
  *H04L 25/40* (2006.01)
(52) U.S. Cl. ...................................... 375/371
(58) Field of Classification Search .............. 375/224, 375/226, 371; 370/516; 702/69
  See application file for complete search history.

(56) References Cited

U.S. PATENT DOCUMENTS

| | | | | |
|---|---|---|---|---|
| 4,253,184 A | * | 2/1981 | Gitlin et al. | 375/232 |
| 4,320,526 A | * | 3/1982 | Gitlin | 375/371 |
| 4,654,861 A | * | 3/1987 | Godard | 375/226 |
| 5,557,196 A | * | 9/1996 | Ujiie | 324/76.77 |
| 6,621,860 B1 | * | 9/2003 | Yamaguchi et al. | 375/226 |
| 6,795,496 B1 | * | 9/2004 | Soma et al. | 375/226 |
| 7,203,229 B1 | * | 4/2007 | Ishida et al. | 375/226 |

OTHER PUBLICATIONS

W. Dalal, and D. Rosenthal, "Measuring Jitter of High Speed Data Channels Using Undersampling Techniques," in Proc. IEEE International Test Conference, pp. 814-818, Washington, D. C., Oct. 18-23, 1998.

Y. Cai, L. Fang, R. Ratemo, J. Liu, K. Gross, and M. Kozma, "A Test Case for 3 Gbps Serial Attached SCSI (SAS)," in Proc. IEEE International Test Conference, Austin, TX, Nov. 8-10, 2005.

* cited by examiner

*Primary Examiner* — Jean B Corrielus
(74) *Attorney, Agent, or Firm* — Osha Liang LLP

(57) ABSTRACT

A jitter measurement apparatus that measures timing jitter of a signal under measurement having a prescribed repeating pattern includes a sampling section that coherently samples the signal under measurement within a prescribed measurement duration; a waveform reconfiguring section that rearranges ordinal ranks of data values sampled by the sampling section to generate a reconfigured waveform that is a reproduction of a waveform of the signal under measurement; an analytic signal generating section that converts the reconfigured waveform into a complex analytic signal; and a jitter measuring section that measures jitter of the signal under measurement based on the analytic signal.

14 Claims, 20 Drawing Sheets

JITTER MEASUREMENT APPARATUS, JITTER CALCULATOR, JITTER MEASUREMENT METHOD, PROGRAM, RECORDING MEDIUM, COMMUNICATION SYSTEM AND TEST APPARATUS

CROSS REFERENCE TO RELATED APPLICATION

This is a continuation in-part application of Ser. No. 12/116,970 filed on May 8, 2008 and Ser. No. 11/535,279 filed on Sep. 26, 2006, the contents of which are incorporated herein by reference.

BACKGROUND

1. Technical Field

The present invention relates to a jitter measurement apparatus, a jitter calculator, a jitter measurement method, a recording medium, a communication system, and a test apparatus.

2. Related Art

Conventional methods for measuring timing jitter with a digital comparator include an undersampling method using a comparator and a fail counting method. These methods measure the RMS value of the jitter in the signal under measurement by calculating a jitter histogram.

The undersampling method using a comparator compares voltage of a signal under test to a reference voltage at strobe timings having frequencies no greater than the Nyquist frequency and supplied from a timing generator. For example, the test apparatus uses, as a repeating strobe signal, a trigger signal generated from the starting time of the test cycle in synchronization with the test signal. Here, strobes having phases that gradually change relative to the test signal can be generated by increasing the time shift between strobes in each test cycle, and these strobes can be used to sample the test signal.

The ratio of logic H at each strobe position is then calculated based on the data obtained from the sampling, thereby obtaining a cumulative density function (CDF) and a probability density function (PDF) of the transition edge timing. The undersampling method using a comparator measures the jitter in this way, as shown, for example, in W. Dalal, and D. Rosenthal, "Measuring Jitter of High Speed Data Channels Using Undersampling Techniques," in Proc. IEEE International Test Conference, pp. 814-818, Washington, D.C., Oct. 18-23, 1998.

The fail counting method measures the jitter by comparing the logic value of the signal under test to an expected value at a timing designated by a strobe. The CDF of the edge timing can be obtained by a fail counter, as shown in, for example, Y. Cai, L. Fang, R. Ratemo, J Liu, K. Gross, and M. Kozma, "A Test Case for 3 Gbps Serial Attached SCSI (SAS)," in Proc. IEEE International Test Conference, Austin, Tex., Nov. 8-10, 2005.

These timing jitter measurement methods, however, obtain the CDF by calculating the ratio of logic H at each strobe timing while gradually increasing the amount of time-shift of the strobe. Such methods take time to sample the amount of data used for the jitter analysis. A jitter measurement method and a jitter measurement apparatus are desired that can accurately calculate the jitter with a short measurement time.

SUMMARY

Therefore, it is an object of an aspect of the innovations herein to provide a jitter measurement apparatus, a jitter calculator, a jitter measurement method, a recording medium, a communication system, and a test apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary jitter measurement apparatus may include a jitter measurement apparatus that measures timing jitter of a signal under measurement having a prescribed repeating pattern, comprising a sampling section that coherently samples the signal under measurement within a prescribed measurement duration; a waveform reconfiguring section that rearranges ordinal ranks of data values sampled by the sampling section to generate a reconfigured waveform that is a reproduction of a waveform of the signal under measurement; an analytic signal generating section that converts the reconfigured waveform into a complex analytic signal; and a jitter measuring section that measures jitter of the signal under measurement based on the analytic signal.

One or more embodiments of the claimed invention provide a jitter measurement apparatus, a jitter calculator, a jitter measurement method, a recording medium, a communication system, and a test apparatus, which are capable of overcoming the above drawbacks accompanying the related art. The above and other embodiments can be achieved by combinations described in the independent claims. The dependent claims define further advantageous and exemplary combinations of the embodiments herein.

One or more embodiments of the claimed invention include a jitter measurement apparatus that measures timing jitter of a signal under measurement having a prescribed repeating pattern, comprising a sampling section that coherently samples the signal under measurement within a prescribed measurement duration; a waveform reconfiguring section that rearranges ordinal ranks of data values sampled by the sampling section to generate a reconfigured waveform that is a reproduction of a waveform of the signal under measurement; an analytic signal generating section that converts the reconfigured waveform into a complex analytic signal; and a jitter measuring section that measures jitter of the signal under measurement based on the analytic signal.

The signal under measurement may repeat the pattern for each set of a prescribed number of bits, the jitter measurement apparatus may further comprise a cumulative waveform generating section that divides the reconfigured waveform into sections that each have an integer multiple of the prescribed number of bits, and generates a cumulative waveform by adding together partial waveforms resulting from the division of the reconfigured waveform, the analytic signal generating section may convert the cumulative waveform into the analytic signal, and the jitter measuring section may measure deterministic jitter of the signal under measurement based on the analytic signal.

The jitter measuring section may calculate a jitter value of the signal under measurement based on the timing jitter sequence. The jitter measuring section may generate a histogram of jitter of the signal under measurement.

The waveform reconfiguring section may rearrange a k-th data value sampled by the sampling section to be an i-th data value of the reconfigured waveform according to an expression $i = k \cdot M \bmod N$, where M represents a number of repetitions of the pattern of the signal under measurement within the measurement duration and N represents a number of samples made by the sampling section within the measurement duration.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
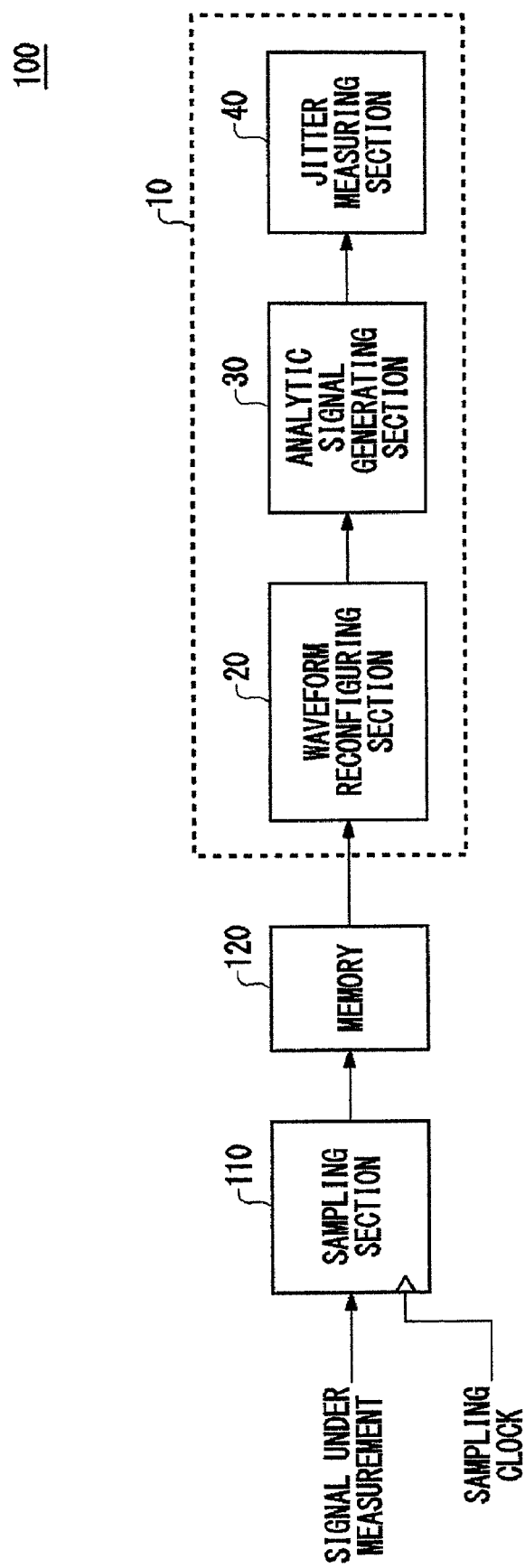
FIG. 1 is a block diagram schematically showing an exemplary configuration of a jitter measurement apparatus 100.

FIG. 1 is a block diagram schematically showing an exemplary configuration of a jitter measurement apparatus 100. The jitter measurement apparatus 100 measures timing jitter of a signal under measurement input thereto. The signal under measurement is a signal having a repeating prescribed pattern. For example, the signal under measurement may be a digital signal having a pattern that repeats every prescribed number of bits or may be a clock signal in which logic H and logic L repeat alternately. The jitter measurement apparatus 100 is provided with a sampling section 110, a memory 120, and a jitter calculator 10.

The sampling section 110 coherently samples the signal under measurement having a period T, within a prescribed measurement duration. The period T of the signal under measurement refers to a period that is repeated by a pattern to be measured, e.g. the product of the number of repeated bits and a 1-bit period Tb.

For example, if the signal under measurement is a clock signal having a logic value that inverts at 1-bit intervals, the period T of the signal under measurement is a duration of 2 bits. The repeating period T may be an integer multiple of the period of the pattern repeated by the signal under measurement. For example, in the case of the clock signal described above, the repeating period T may be an integer multiple of a duration corresponding to 2 bits. If the signal under measurement repeats a 3-bit pattern such as "101," the repeating period T may be an integer multiple of a duration corresponding to 3 bits.

The sampling section 110 coherently samples the signal under measurement such that, over a duration M times the repeating period T of the signal under measurement, i.e. the unit measurement duration, the number of samples N is coprime to the number of repetitions M. The relationship between the unit measurement duration P, the number of repetitions M, the repeating period T, the number of samples N, and the sampling period Ts is expressed below. As shown in Expression 1, the unit measurement duration P is an integer multiple of the repeating period T of the signal under measurement and is also an integer multiple of the sampling period Ts.

$$P=MT=NTs \qquad \text{Expression 1}$$

The measurement duration over which the signal under measurement is sampled may be an integer multiple of the unit measurement duration P. The following describes a sampling operation of the jitter measurement apparatus 100 in one unit measurement duration P, but the jitter measurement apparatus 100 may continuously repeat this operation an integer number of times to sample the signal under measurement over a measurement duration that is an integer multiple of the unit measurement duration P.

The sampling section 110 may sample the signal under measurement according to a sampling clock provided thereto. The jitter measurement apparatus 100 may control at least one of the repeating period T, the number of repetitions M, the number of samples N, and the sampling period Ts to satisfy Expression 1. Here, N indicates the number of samples in a unit measurement duration P.

The sampling section 110 samples the signal under measurement and inputs an input waveform $X_S[k]$ into the memory 120. Here, k indicates the ordinal rank of the sample values acquired by the sampling section 110. In the present embodiment, the values of k are 0, 1, 2, ..., N−2, N−1.

The sampling section 110 may be a voltage comparator or an AD converter (referred to hereinafter as an "ADC"), for example. The sampling section 110 may be a digital comparator or a waveform digitizer. The resolution of the ADC may be 1 bit or 1.6 bits. If the resolution of the ADC is 1 bit, each sample value of the input waveform $X_S[k]$ may be expressed as a binary logic value, such as a logic value of 0 or 1. If the resolution of the ADC is 1.6 bits, each sample value of the input waveform $X_S[k]$ may be expressed as one of three possible values.

The memory 120 stores the sampling results from the sampling section 110. For example, the memory 120 may store each sample value of the input waveform $X_S[k]$ obtained by the sampling section 110 sampling the signal under measurement, in association with the sample ordinal rank k expressed as an integer from 0 to N−1.

The jitter calculator 10 calculates the jitter of the signal under measurement based on the sampling data obtained by coherently sampling the signal under measurement having the prescribed repeating pattern. The jitter calculator 10 of the present embodiment calculates the jitter of the signal under measurement based on the input waveform $X_S[k]$ measured by the sampling section 110 provided to the jitter measurement apparatus 100, but as another example, the jitter calculator 10 may receive data measured in advance by an external apparatus provided to the jitter measurement apparatus 100 and calculate the jitter of the signal under measurement based on this data.

The jitter calculator 10 of the present embodiment includes a waveform reconfiguring section 20, an analytic signal generating section 30, and a jitter measuring section 40. The waveform reconfiguring section 20 reads the input waveform $X_S[k]$ stored in the memory 120 and generates a reconfigured waveform in which the ordinal ranks of the pieces of data of the input waveform $X_S[k]$ are rearranged. More specifically, the waveform reconfiguring section 20 generates the reconfigured waveform $X_R[i]$ based on Expression 2.

$$i=(k \cdot M) \bmod N \qquad \text{Expression 2}$$

Here, i indicates the ordinal rank of a data value in the reconfigured waveform $X_R[i]$, and takes the value of an integer from 0 to N−1. When the number of repetitions M is expressed as M=nN+1, where n is any natural number, i is equal to k, and therefore the reconfiguration process described above is omitted so that the input signal $X_S[k]$ sampled by the sampling section 110 is output as the reconfigured waveform $X_R[i]$.

When the jitter measurement apparatus 100 samples the signal under measurement with a measurement duration that is A times the unit measurement duration P, the ordinal ranks k of the data values of the input waveform are k=0, 1, 2, . . . , A(N−1)−1, A(N−1). The waveform reconfiguring section 20 applies Expression 2 to each unit measurement duration P to reconfigure the waveform for each unit measurement duration P. Here, the waveform reconfiguring section 20 may apply Expression 2 to the waveform sampled over each unit measurement duration P such that the first data value sampled in a unit measurement duration P has an ordinal rank of 0. The waveform reconfiguring section 20 may generate the reconfigured waveform over the entire measurement duration by connecting the waveforms reconfigured for each unit measurement duration P.

By sampling the signal under measurement while fulfilling the condition of Expression 1 and replacing the ordinal ranks of the sample values according to Expression 2, the jitter measurement apparatus 100 can generate the reconfigured waveform $X_R[i]$, which is a reproduction of the waveform obtained by sampling the signal under measurement with an equivalent sampling period Te that is shorter than the sampling period Ts. The equivalent sampling period Te is expressed by Expression 3.

$$Te=P/(MN)=T/N=Ts/M \qquad \text{Expression 3}$$

The analytic signal generating section 30 converts the reconfigured waveform $X_R[i]$ generated by the waveform reconfiguring section 20 into a complex analytic signal. The analytic signal may include the reconfigured waveform $X_R[i]$ as the real portion and a waveform obtained by shifting the phase of the reconfigured waveform $X_R[i]$ by 90 degrees as the imaginary portion. An exemplary process performed by the analytic signal generating section 30 is described later using FIG. 5 and the like.

The jitter measuring section 40 measures the jitter of the signal under measurement based on the instantaneous phase of the analytic signal. An exemplary process performed by the jitter measuring section 40 is described later using FIG. 5 and the like. With this configuration, the jitter measurement apparatus 100 can accurately analyze the jitter of the signal under measurement using a sampling clock having a relatively large period.

Figure 2:
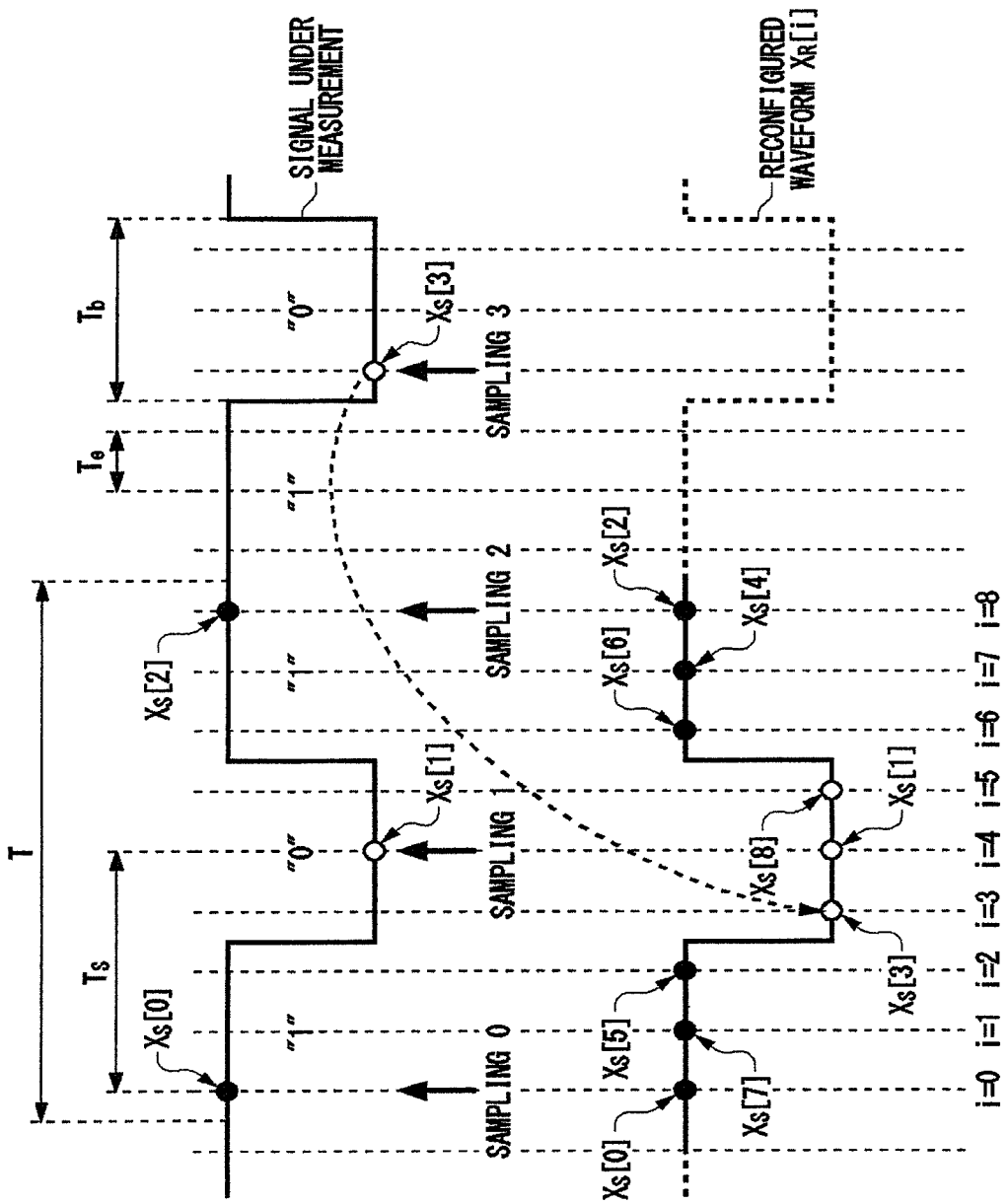
FIG. 2 schematically shows a method performed by the waveform reconfiguring section 20 for shaping a reconfigured waveform using the waveform of the signal under measurement and the each waveform of the reconfigured waveform.

FIG. 2 schematically shows a method performed by the waveform reconfiguring section 20 for shaping a reconfigured waveform using the waveform of the signal under measurement and the waveform of the reconfigured waveform. FIG. 2 shows, as the signal under measurement, a data signal having a bit period of Tb and a data pattern repetition period L of 3 bits. The signal under measurement of the present embodiment repeats a data pattern of "101." In FIG. 2, the white circles indicate sample values with a logic value of 0 and black circles indicate sample values with a logic value of 1.

The sampling section 110 of the present embodiment samples the signal under measurement at sampling frequencies Ts in synchronization with the repeating period of the signal under measurement. The equivalent sampling time interval Te is Tb/3, and the sampling period Ts is 4Te. At this time, according to Expression 3, N=9 and M=4, such that M and N are coprime.

In FIG. 2, "sampling k" indicates the k-th sampling timing. For example, "sampling 0" indicates the start point of the sampling, i.e. a timing at which k=0.

In the present embodiment, the sample value of the input waveform $X_S[0]$ at the timing of sampling 0 has a logic value of 1, as shown in FIG. 2. Sampling 1, indicates a point in time that is Ts later than the sampling 0, i.e. a timing at which k=1. The sample value of the input waveform $X_S[1]$ at the timing of sampling 1 has a logic value of 0. The input waveform $X_S[k]$ is obtained by sampling the signal under measurement at each sampling timing k=0 to k=8, in the manner described above.

The sample values of the input waveform $X_S[k]$ obtained by the sampling section 110 through the sampling described above are lined-up according to the original ordinal ranks k sampled by the sampling section 110. The waveform reconfiguring section 20 can obtain the reconfigured waveform $X_R[i]$ having the period T by rearranging the ordinal ranks of the sample values at the equivalent sampling period Te, according to the rearranged ordinal rank i. The rearranged ordinal rank i can be calculated from Expression 1.

For example, the value of i corresponding to k=3 is i=(3·4) mod 9=3. The reconfigured waveform $X_R[i]$ can be obtained by rearranging each sample value from k=0 to k=8 in the same manner.

Figure 3:
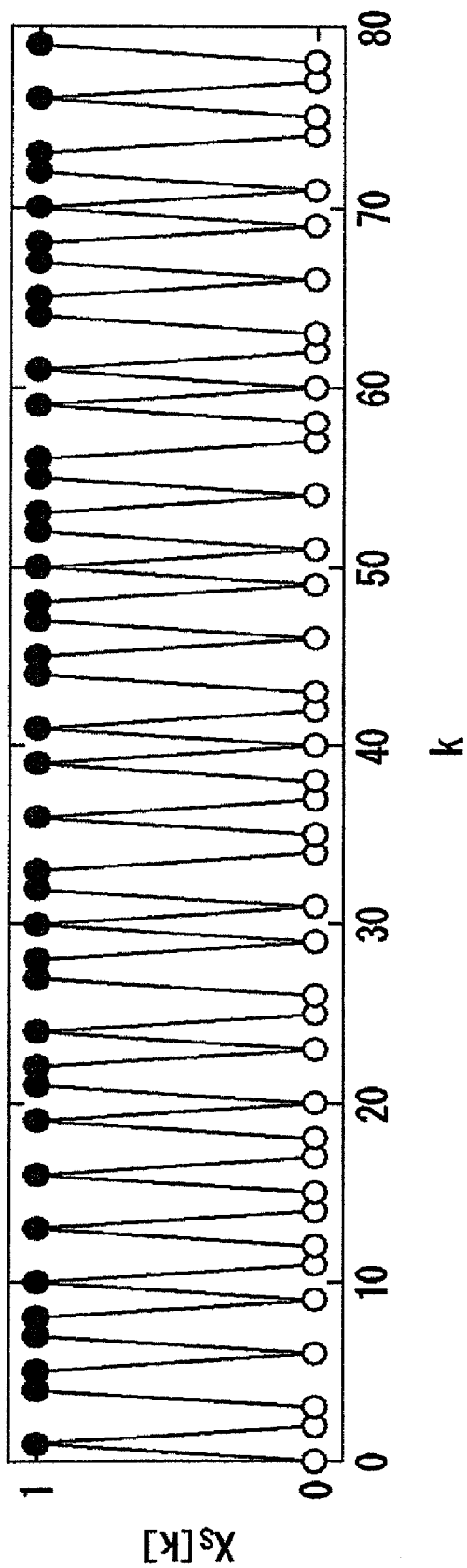
FIG. 3 shows exemplary sample values of the input signal $X_S[k]$.

FIG. 3 shows exemplary sample values of the input signal $X_S[k]$. FIG. 3 shows a different sampling result obtained when the signal under measurement is sampled by an ADC having a 1-bit resolution. FIG. 3 uses a clock pattern as the signal under measurement. The sampling frequency Ts is set such that M and N are coprime.

The sampling frequency Ts may be less than the Nyquist frequency or may be greater than or equal to the Nyquist frequency. As shown in FIG. 3, 80 samples are taken from k=0 to k=79.

Figure 4:
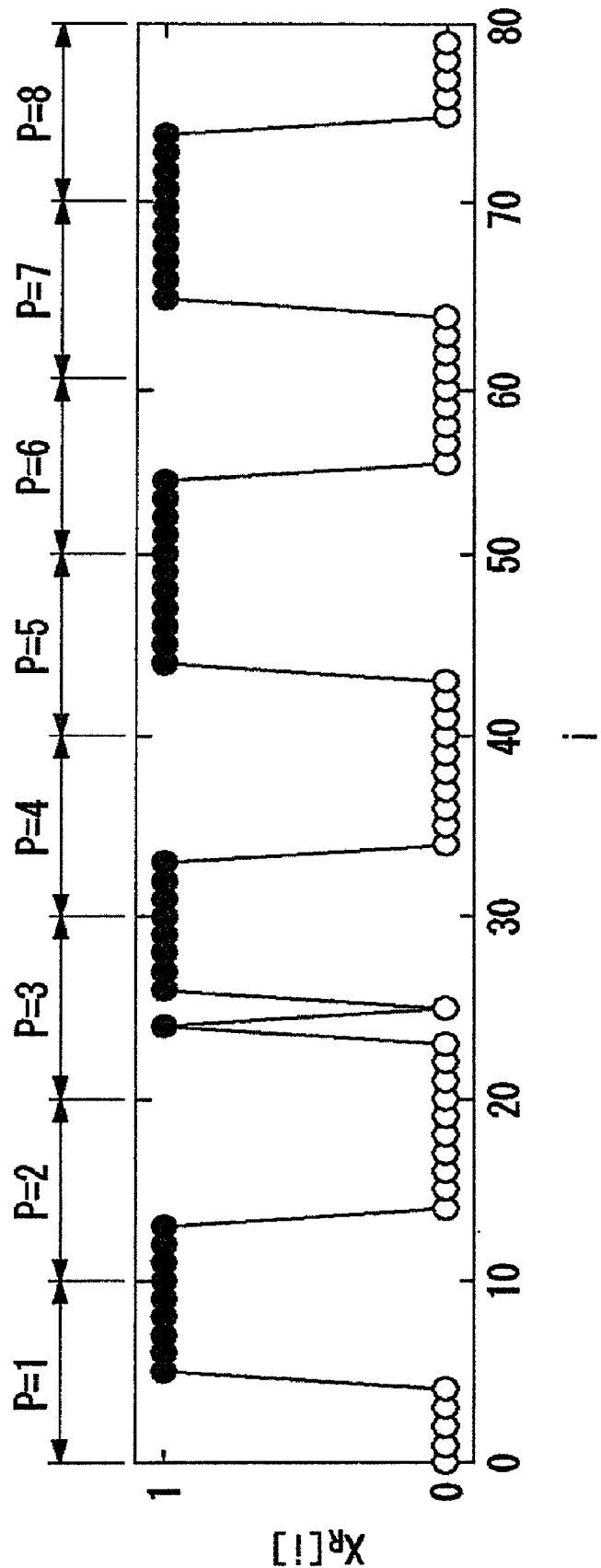
FIG. 4 schematically shows an exemplary reconfigured waveform $X_R[i]$ obtained by reconfiguring the input waveform $X_S[k]$ shown in FIG. 3.

FIG. 4 schematically shows an exemplary reconfigured waveform $X_R[i]$ obtained by reconfiguring the input waveform $X_S[k]$ shown in FIG. 3. The reconfigured waveform $X_R[i]$ has 80 sample values from i=0 to i=79, and the time interval between sample values is expressed as the equivalent sampling time interval Te.

As shown in FIG. 4, the reconfigured waveform $X_R[i]$, which is a reproduction of the pattern of the signal under measurement, can be obtained by reconfiguring the input waveform $X_S[k]$ according to Expression 2. The waveform reconfiguring section 20 of the present embodiment obtains a reconfigured waveform $X_R[i]$ in which the bit pattern "01" of a unit period waveform $X_P[m]$ repeats four times.

As shown in FIG. 4, when obtaining the reconfigured waveform $X_R[i]$ in which the unit period waveform $X_P[m]$ repeats multiple times, the sampling section 110 may perform coherent sampling that fulfills the conditions of Expression 1, where the repeating period T is a value obtained by multiplying (i) the period of the unit period waveform $X_P[m]$ by (ii) the number of repetitions of the unit period waveform included in the reconfigured waveform. In this case, the waveform reconfiguring section 20 rearranges all of the sample values of the input waveform $X_S[k]$. In the example of FIG. 4, the waveform reconfiguring section 20 calculates each sample value of the reconfigured waveform $X_R[i]$ by sequentially substituting values of k from 0 to 79 into Expression 2.

The sampling section 110 may perform coherent sampling that fulfills the conditions of Expression 1 for the unit measurement duration P, where the repeating period T is the period of the unit period waveform $X_P[m]$. By using a measurement duration that is an integer multiple of the unit measurement duration P, the coherent sampling is repeated according to the number of repetitions of the unit measurement duration P. Therefore, the waveform reconfiguring section 20 may divide the obtained input waveform $X_S[k]$ according to the number of repetitions of the unit measurement duration P, and reconfigure the waveform for each of these sections.

In the example of FIG. 4, the waveform reconfiguring section 20 divides the input waveform $X_S[k]$ into four sections, which are k=0 to 19, k=20 to 39, k=40 to 59, and k=60 to 79. The waveform reconfiguring section 20 calculates a reconfigured waveform for each section by sequentially replacing the sample values in each section. These reconfigured waveforms are connected to achieve the reconfigured waveform $X_R[i]$ shown in FIG. 4.

Figure 5:
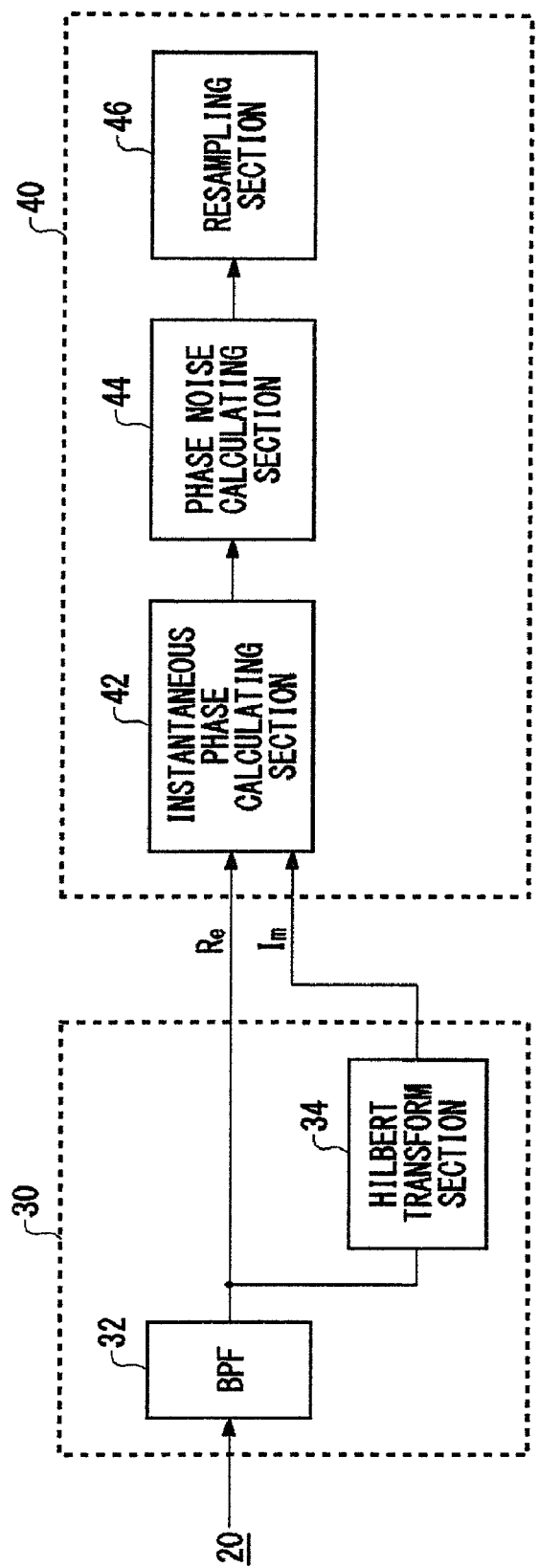
FIG. 5 shows exemplary configurations of the analytic signal generating section 30 and the jitter measuring section 40. The analytic signal generating section 30 includes a band limiter 32 and a Hilbert transform section 34.

FIG. 5 shows exemplary configurations of the analytic signal generating section 30 and the jitter measuring section 40. The analytic signal generating section 30 includes a band limiter 32 and a Hilbert transform section 34. The band limiter 32 passes a component near the fundamental frequency of the reconfigured waveform generated by the waveform reconfiguring section 20, and eliminates other components. The pass band of the band limiter 32 may be set to be a prescribed range centered on the fundamental frequency of the signal under measurement. The band limiter 32 may include hardware such as an analog filter or a digital filter, or may include software for performing an FFT on the data of the reconfigured waveform.

The Hilbert transform section 34 performs a Hilbert transform on the signal passed by the band limiter 32, and outputs the resulting signal. The Hilbert transform section 34 may include a Hilbert filter. The analytic signal generating section 30 may output, as an analytic signal of the reconfigured waveform, a complex signal whose real part is the signal passed by the band limiter 32 and whose imaginary part is the signal output by the Hilbert transform section 34.

The jitter measuring section 40 includes an instantaneous phase calculating section 42, a phase noise calculating section 44, and a resampling section 46. The instantaneous phase calculating section 42 calculates the instantaneous phase of the reconfigured waveform based on the analytic signal output by the analytic signal generating section 30. For example, the instantaneous phase calculating section 42 may calculate an instantaneous phase waveform of the reconfigured waveform from an arctangent of the ratio between the real part and the imaginary part in the analytic signal.

The phase noise calculating section 44 calculates an instantaneous phase noise waveform of the reconfigured waveform by eliminating a linear instantaneous phase component from the instantaneous phase waveform calculated by the instantaneous phase calculating section 42. The linear instantaneous phase component of the instantaneous phase waveform may be calculated by using a least square method or the like to linearly approximate the instantaneous phase waveform.

The resampling section 46 samples the instantaneous phase noise waveform calculated by the phase noise calculating section 44 to calculate a timing jitter sequence of the reconfigured waveform. For example, the resampling section 46 may sample the instantaneous phase noise waveform according to zero-cross timings of the signal under measurement or the reconfigured waveform.

Figure 6:
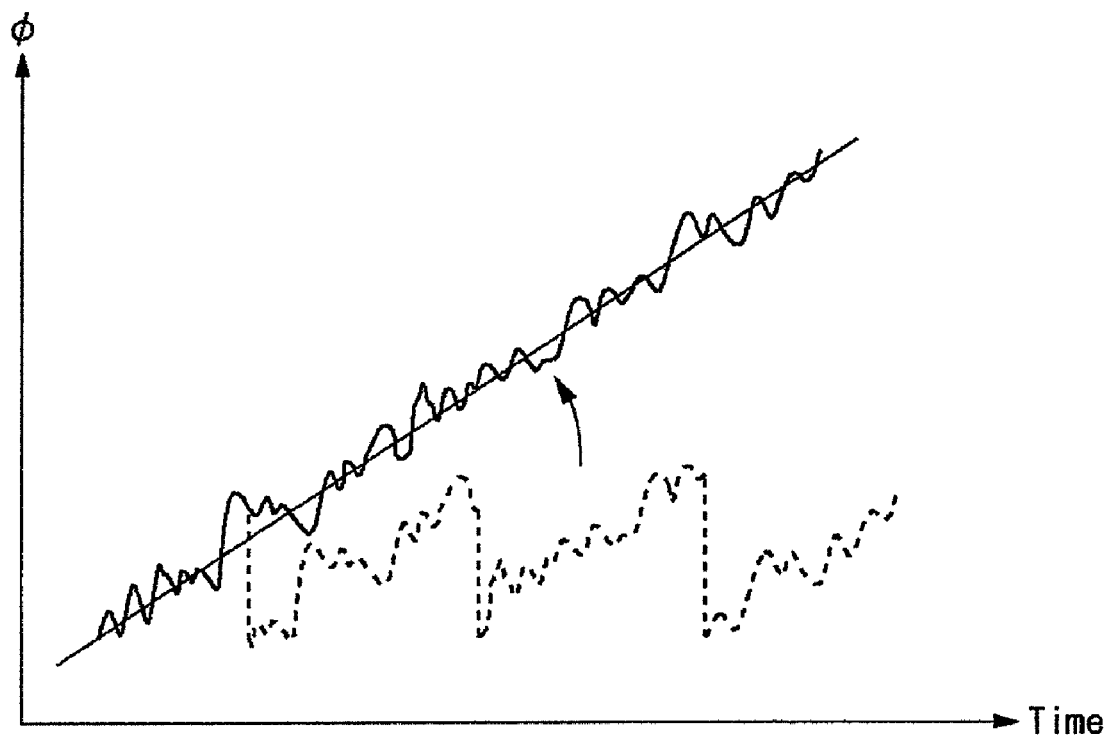
FIG. 6 shows exemplary operations of the instantaneous phase calculating section 42 and the phase noise calculating section 44.

FIG. 6 shows exemplary operations of the instantaneous phase calculating section 42 and the phase noise calculating section 44. The instantaneous phase calculating section 42 calculates the arctangent of the real part and the imaginary part of the analytic signal to calculate the instantaneous phase of the signal under measurement. The instantaneous phase may be provided as a principle value ranging from $\pi$ to $-\pi$, as shown by the dotted line in FIG. 6. The instantaneous phase calculating section 42 calculates a continuous instantaneous phase, as shown by the solid line in FIG. 6, by unwrapping the above instantaneous phase. In other words, the instantaneous phase calculating section 42 calculates the continuous instantaneous phase by sequentially adding $2\pi$ to the discontinuous instantaneous phase according to the period of the data signal.

The phase noise calculating section 44, eliminates the linear component from the continuous instantaneous phase calculated by the instantaneous phase calculating section 42. The phase noise calculating section 44 may calculate the linear component by using the least square method or the like to approximate the continuous instantaneous phase, and may eliminate the calculated linear component. Since the linear component corresponds to the instantaneous phase when there is no jitter, the difference between the linear component and the calculated instantaneous phase corresponds to the phase noise component of the clock signal.

Figure 7:
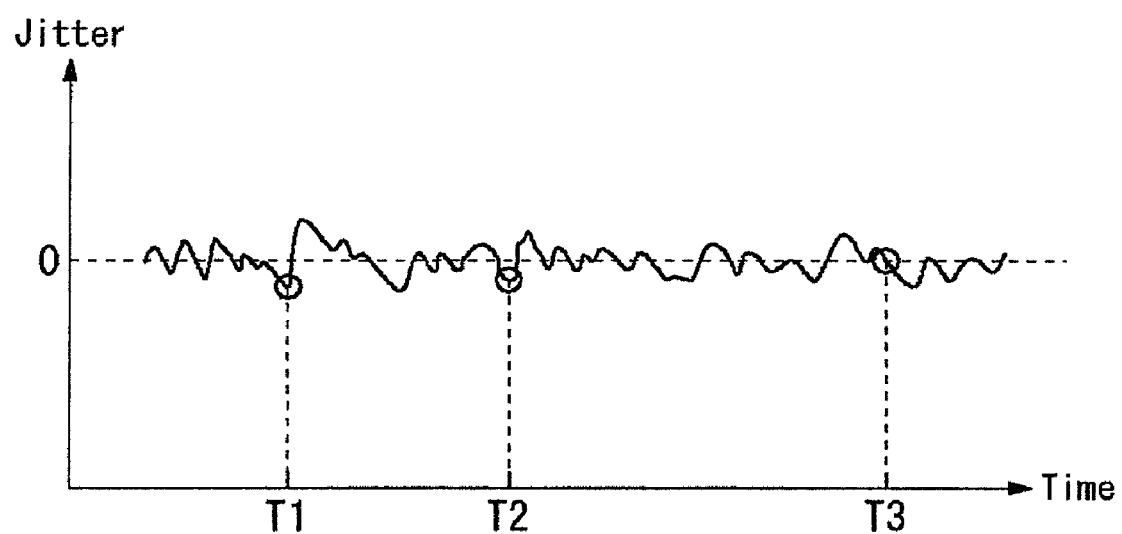
FIG. 7 shows an exemplary operation of the resampling section 46.

FIG. 7 shows an exemplary operation of the resampling section 46. The resampling section 46 samples the instantaneous phase noise component calculated by the phase noise calculating section 44, at the data transition edge timings of the signal under measurement, i.e. T1, T2, and T3. The sampling results are represented as a timing jitter sequence indicating the timing jitter at each edge of the signal under measurement.

The jitter measuring section 40 may calculate the RMS value of the timing jitter sequence. The jitter measuring section 40 may calculate the peak value, the peak-to-peak value, or the like of the timing jitter sequence. The jitter measuring section 40 may calculate the jitter value of the signal under measurement from these calculated values. The jitter measuring section 40 may generate a histogram including each value of the timing jitter sequence. The jitter measuring section 40 may further include a jitter calculating section that calculates the jitter values or the histogram.

Figure 8:
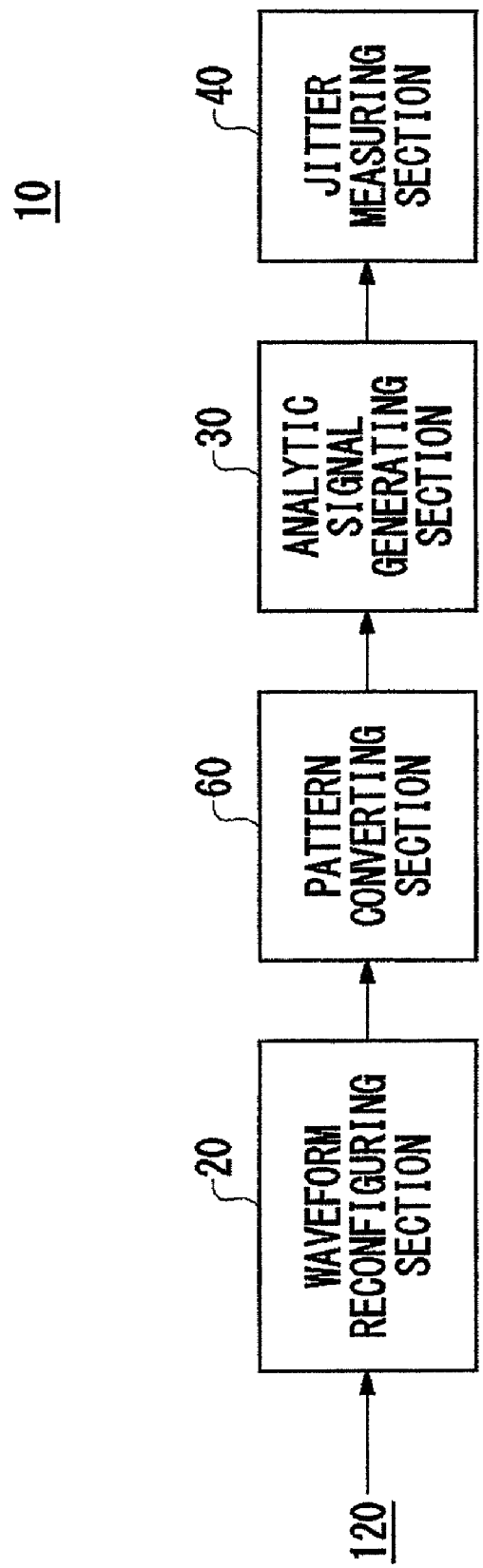
FIG. 8 shows another exemplary configuration of the jitter calculator 10.

FIG. 8 shows another exemplary configuration of the jitter calculator 10. The jitter calculator 10 of the present embodiment is provided with a pattern converting section 60 in addition to the configuration of the jitter calculator 10 described in relation to FIG. 1.

The pattern converting section 60 converts the pattern of the reconfigured waveform generated by the waveform reconfiguring section 20 into a clock pattern, and inputs the clock pattern to the analytic signal generating section 30. The clock pattern generated by the pattern converting section 60 has edges at prescribed timings at bit boundaries where the logic value of the reconfigured waveform does not change, and edges having the same timing as the transition timing of the logic value at bit boundaries where the logic value of the reconfigured waveform changes.

The prescribed timings of these edges may be the ideal timings of the bit boundaries in the reconfigured waveform, or may be timings obtained by interpolating into the timings of the leading and trailing edges in the reconfigured waveform. By using the pattern converting section 60, the jitter calculator 10 can measure the jitter using the method described in relation to FIGS. 1 to 7, even if the signal under measurement is not a clock pattern.

Figure 9:
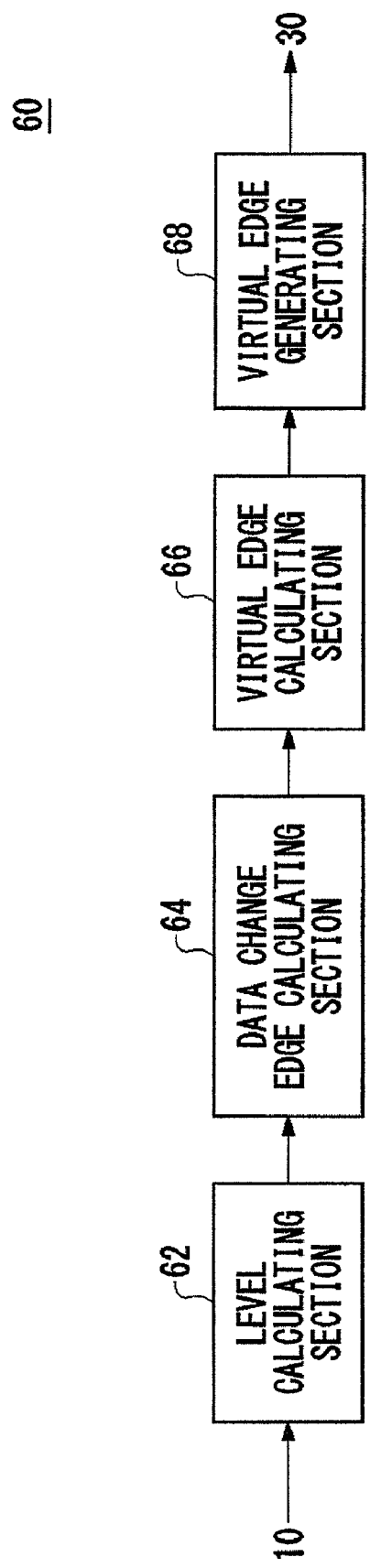
FIG. 9 shows an exemplary configuration of the pattern converting section 60.

FIG. 9 shows an exemplary configuration of the pattern converting section 60. The pattern converting section 60 includes a level calculating section 62, a data transition edge calculating section 64, a virtual edge calculating section 66, and a virtual edge generating section 68.

Figure 10:
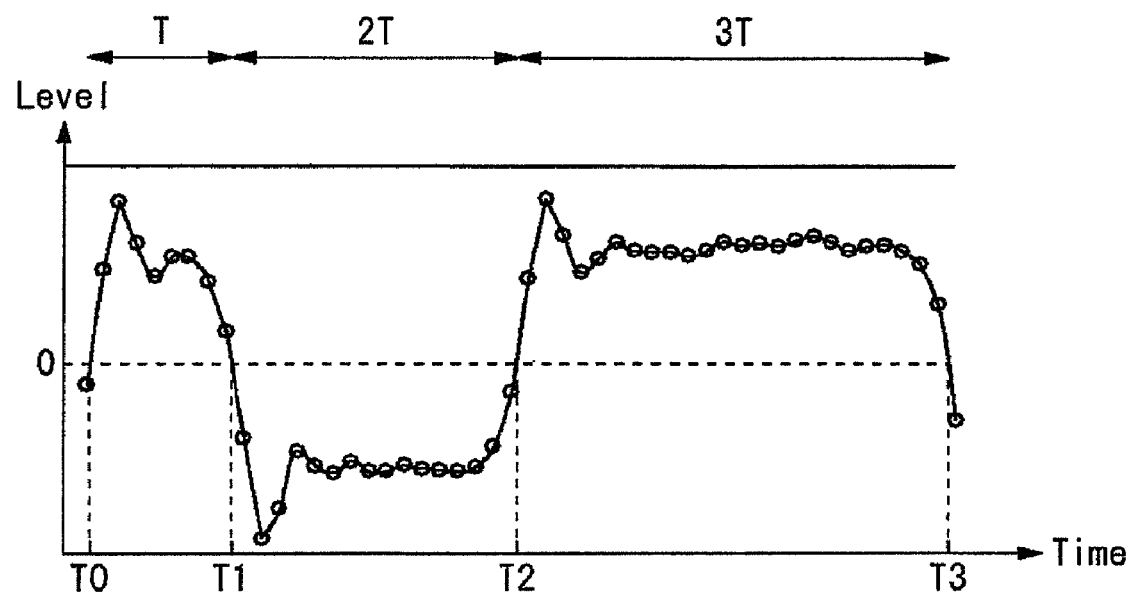
FIG. 10 shows an exemplary reconfigured waveform input to the pattern converting section 60.
Figure 11:
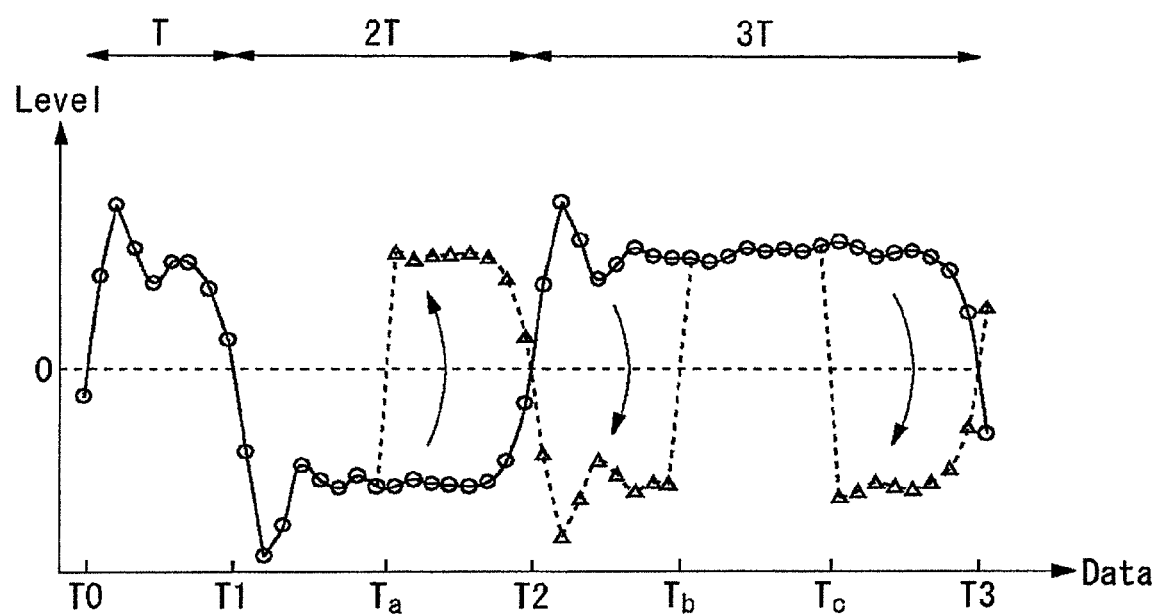
FIG. 11 shows an exemplary operation of the pattern converting section 60.
Figure 12:
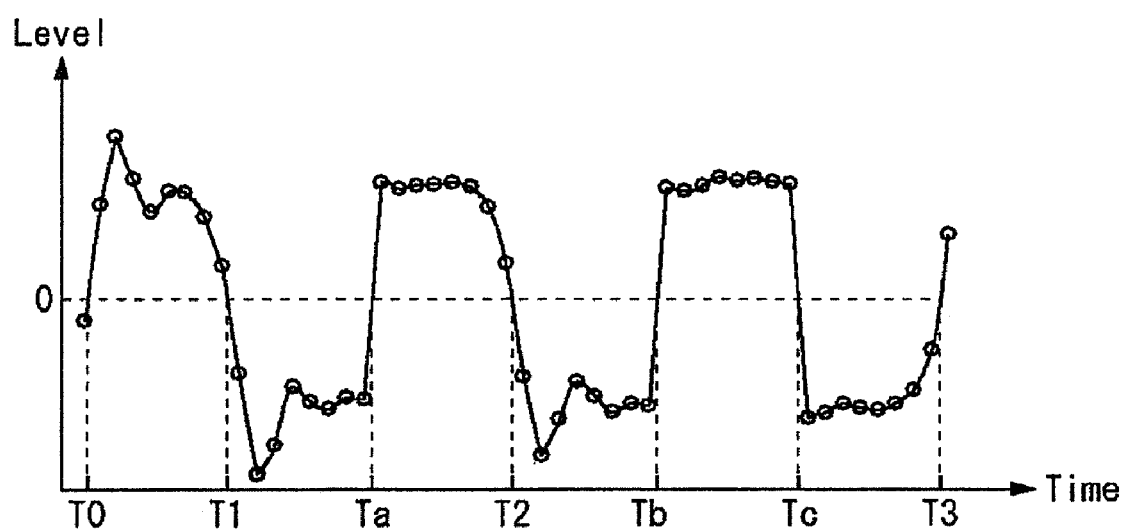
FIG. 12 shows an exemplary reconfigured waveform into which the virtual edge generating section 68 has inserted virtual edges.

FIGS. 10 to 12 show exemplary operations of the pattern converting section 60.

FIG. 10 shows an exemplary reconfigured waveform input to the pattern converting section 60. In this example, the bit period of the reconfigured waveform is T, and the data pattern is "100111." The pattern converting section 60 is supplied with discrete signals indicated by the circles in FIG. 10.

FIG. 11 shows an exemplary operation of the pattern converting section 60. As described above, the pattern converting section 60 generates a clock pattern that keeps the timings T1, T2, and T3 of the data transition edges of the reconfigured waveform shown in FIG. 10 and has edges at timings T1, Ta, T2, Tb, Tc, and T3 that are substantially equal to the data rate of the reconfigured waveform.

For example, the pattern converting section 60 may calculate the intervals between the timings T1, T2, and T3 of the data transition edges, which are T, 2T, and 3T in FIG. 10, and may make a comparison between (i) each of these intervals and (ii) the data rate of the reconfigured waveform. If an interval between a pair of data transition edges is greater than the data rate by a prescribed value or more, a virtual edge is inserted between these data transition edges.

More specifically, the level calculating section 62 calculates a reference level of the reconfigured waveform. This reference level of the reconfigured waveform may be an average level obtained as the average of the H level, i.e. a 100% level of the reconfigured waveform, and the L level, i.e. a 0% level of the reconfigured waveform. In other words, the reference level of the reconfigured waveform is substantially 50% of the H level of the reconfigured waveform.

The level calculating section 62 may calculate the reference level as being an average value of the discrete values of the reconfigured waveform. In this case, the level calculating section 62 desirably calculates the average value based on a sufficiently high number of discrete values. The level calculating section 62 may instead calculate the reference value as being an average value calculated using substantially equal numbers of data pieces indicating H level and L level. The reference level may be set in advance by a user or the like. The level calculating section 62 may set the reference value as the zero level. In the present embodiment, the reference level is the zero level.

The data transition edge calculating section 64 calculates the timings, e.g. the data numbers, at which the data value of the reconfigured waveform changes, based on the discrete signal shown by circles in FIG. 11. In other words, the data transition edge calculating section 64 detects the timings at which the data value of the discrete signal changes in a manner to cross a boundary defined as the reference level of the reconfigured waveform. The data transition edge calculating section 64 of the present embodiment detects the data numbers at which the sign of a data value of the discrete signal changes from the sign of an immediately prior data value.

The data transition edge calculating section 64 may detect data numbers that are integers, or may calculate data numbers that are real numbers. When calculating real data numbers, each sample value of the reconfigured waveform may be provided as a discrete value having three or more possible values. The data transition edge calculating section 64 performs a linear interpolation for two pieces of data between which the data value changes, and calculates a timing at which this line crosses the reference level.

The virtual edge calculating section 66 and the virtual edge generating section 68 generate a clock signal having virtual edges at substantially constant intervals corresponding to the data rate between data transition edges of the reconfigured waveform, where the intervals between edges are greater than a prescribed value. In the present embodiment, the virtual edges are included between transition edges separated by intervals greater than or equal to 1.5 times the data rate. Furthermore, the number of virtual edges to be inserted is calculated according to how many bits of the reconfigured waveform an interval between edges corresponds to. In the present embodiment, the virtual edge calculating section 66 calculates the timings Ta, Tb, and Tc at which a virtual edge is to be inserted, and the virtual edge generating section 68 generates virtual edges at these timings.

The virtual edge calculating section 66 calculates the interval between each pair of data transition edges, i.e. T0 to T1, T1 to T2, and T2 to T3, based on the timings, i.e. data numbers, calculated by the data transition edge calculating section 64 at which the data value changes. The virtual edge calculating section 66 then calculates the number of virtual edges to be inserted between each pair of data transition edges.

For example, the virtual edge calculating section 66 divides the calculated interval between a pair of edges by the data rate and rounds the result to the nearest integer. The virtual edge calculating section 66 calculates the number of virtual edges to be inserted into this interval between edges as being a value obtained by subtracting 1 from the above calculation result. In the present embodiment, when the data rate of the data signal is T, the number of virtual edges to be inserted in the first data transition edge interval (T0 to T1) is zero, the number of virtual edges to be inserted in the second data transition edge interval (T1 to T2) is one, and the number of virtual edges to be inserted in the third data transition edge interval (T2 to T3) is two.

The virtual edge calculating section 66 calculates the timing of each virtual edge such that the virtual edges are arranged at substantially equal intervals between each pair of data transition edges. For example, one virtual edge is inserted in the second data transition edge interval (T1 to T2), and so the virtual edge calculating section 66 calculates the timing of the virtual edge to be the timing Ta at the substantial center between the two data transition edges T1 and T2. Furthermore, two virtual edges are inserted in the third data transition edge interval (T2 to T3), and so the virtual edge calculating section 66 calculates the timing of the virtual edges to be the timings Tb and Tc obtained by dividing the interval between the two data changes edges T2 and T3 into thirds.

The virtual edge generating section 68 generates the virtual edges by inverting the data value of the discrete signal around the reference level of the data signal, according to the timing of the virtual edges calculated by the virtual edge calculating section 66. In FIG. 4, for example, each virtual edge represented as a dotted line may be generated by replacing (i) each piece of discrete data indicated by a circle from the timing of an odd-numbered virtual edge to the timing of an even-numbered virtual edge with (ii) an inverted piece of data indicated by a triangle. As another example, after the reference level of the discrete signal is shifted to be substantially zero, the virtual edges may be generated by multiplying (i) each piece of discrete data from the timing of an odd-numbered virtual edge to the timing of an even-numbered virtual edge by (ii)-1.

In the processes described above, the data from the timing of an odd-numbered virtual edge to the timing of an even-numbered virtual edge is inverted, but it is also acceptable to invert the data from the timing of an even-numbered virtual edge to the timing of an odd-numbered virtual edge.

FIG. 12 shows an exemplary reconfigured waveform into which the virtual edge generating section 68 has inserted virtual edges. The reconfigured waveform is converted into a clock pattern using the process described above. The virtual edges inserted into the reconfigured waveform are linearly interpolated between the actual data transition edges of the reconfigured waveform, and so the jitter of the virtual edges has an extremely small effect on the jitter of the data transition edges.

Figure 13:
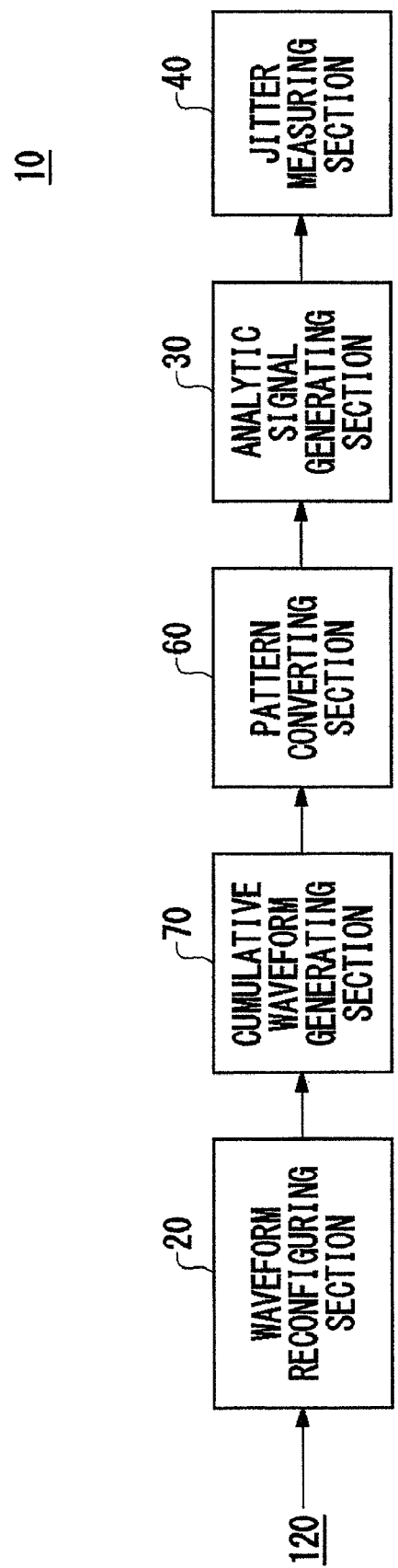
FIG. 13 shows another exemplary configuration of the jitter calculator 10.

FIG. 13 shows another exemplary configuration of the jitter calculator 10. The jitter calculator 10 is provided with a cumulative waveform generating section 70 in addition to the configuration of any one of the jitter calculators 10 described in relation to FIGS. 1 to 12. The present embodiment describes a case where the cumulative waveform generating section 70 is provided to the jitter calculator 10 described in relation to FIG. 9.

In the present embodiment, the signal under measurement repeats a pattern having L bits. The cumulative waveform generating section 70 divides the reconfigured waveform output by the waveform reconfiguring section 20 into sections that are each an integer multiple of the L-bit repeating period of the signal under measurement. The cumulative waveform generating section 70 calculates each partial waveform resulting from the division of the reconfigured waveform. The cumulative waveform generating section 70 generates a cumulative waveform by adding together the partial waveforms such that the edge timing of the cumulative waveform is the average of the edge timings of each partial waveform.

For example, the waveform reconfiguring section 20 may calculate, as the logic value at each phase of the cumulative waveform, a summation of the logic values at the corresponding phase in each partial waveform. The cumulative waveform generating section 70 may calculate the average of the corresponding edge timings in each partial waveform, and generate the cumulative waveforms to have edges at these average timings.

Generally, the jitter applied to the edges of a signal includes random jitter and deterministic jitter. The deviation in the edge timing distribution caused by the random jitter can be represented as a Gaussian distribution centered on the ideal edge timing. Therefore, the average value of the random jitter is substantially zero.

As described above, each edge timing of the cumulative waveform is the average of the corresponding edge timing in each partial waveform. Therefore, the random component can be eliminated from the jitter at each edge of the cumulative waveform. Accordingly, the deterministic component can be accurately measured by measuring the jitter based on the cumulative waveform.

Figure 14:
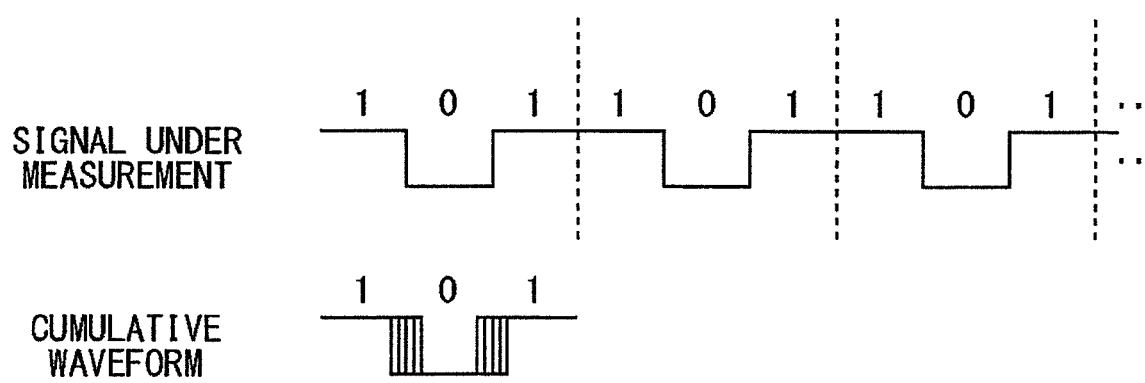
FIG. 14 shows an exemplary operation of the cumulative waveform generating section 70.

FIG. 14 shows an exemplary operation of the cumulative waveform generating section 70. The signal under measurement in the present embodiment repeats a prescribed pattern, e.g. "101" in FIG. 14, for each prescribed number of bits, e.g. three bits in FIG. 14.

The cumulative waveform generating section 70 divides the reconfigured waveform obtained by reconfiguring the signal under measurement into sections containing the prescribed number of bits, i.e. three bits. The cumulative waveform generating section 70 may divide the reconfigured waveform such that the edges of the reconfigured waveform are located greater than or equal to a prescribed distance from the division boundaries. The waveform reconfiguring section 20 may generate the reconfigured waveform to have a data length including at least two repetitions of the prescribed pattern. In this case, the sampling section 110 acquires a number of samples sufficient to generate the reconfigured waveform.

The cumulative waveform generating section 70 generates the cumulative waveform by adding together each partial waveform obtained by dividing the reconfigured waveform. Since the random component in the cumulative waveform is eliminated as described above, the deterministic jitter can be accurately measured based on the cumulative waveform.

Figure 15:
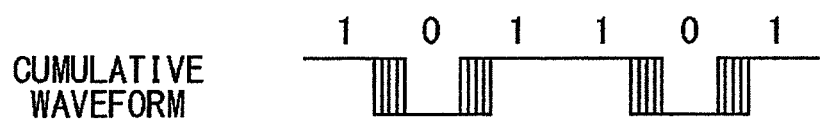
FIG. 15 shows another exemplary operation of the cumulative waveform generating section 70.

FIG. 15 shows another exemplary operation of the cumulative waveform generating section 70. As described above, the cumulative waveform generating section 70 may divide the reconfigured waveform such that the period of each partial waveform is an integer multiple, e.g. two in the present embodiment, of the repeating period, e.g. three bits in the present embodiment, of the signal under measurement. In this case, the resulting cumulative waveform includes the repeating pattern multiple times. The RMS value, peak value, or the like of the deterministic jitter can be accurately measured by measuring the jitter based on the cumulative waveform.

Figure 16:
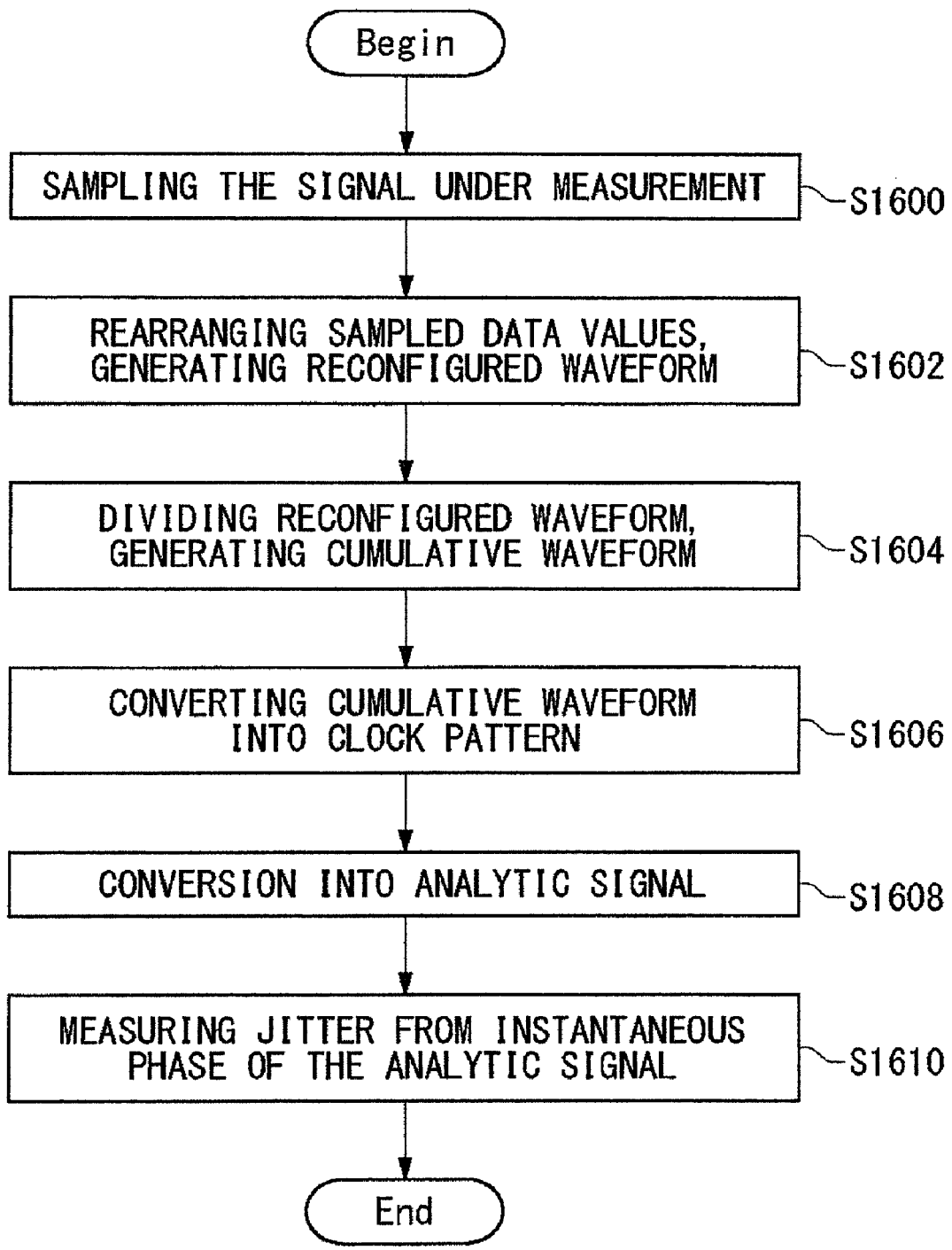
FIG. 16 is a flow chart showing an exemplary operation of the jitter measurement apparatus 100 described in relation to FIG. 13.

FIG. 16 is a flow chart showing an exemplary operation of the jitter measurement apparatus 100 described in relation to FIG. 13. First, at S1600, the sampling section 110 obtains a sequence of sample values of the input waveform $X_S[k]$ by sampling the signal under measurement having a period T. The sampling section 110 samples the signal under measurement N times over a duration of M repetitions of the prescribed pattern of the signal under measurement, where M and N are coprime. The sequence of sample values is stored in the memory 120.

Next, at S1602, the waveform reconfiguring section 20 generates the reconfigured waveform $X_R[i]$ by reconfiguring the input waveform $X_S[k]$. The sample values stored in the memory 120 are read, and the input waveform $X_S[k]$ may be rearranged such that the ordinal ranks k are changed to rearranged ordinal ranks i, where i=(k·M)mod N. At S1604, the cumulative waveform generating section 70 generates the cumulative waveform by adding together the partial waveforms obtained by dividing the reconfigured waveform $X_R[i]$ into unit periods.

Next, at S1606, the pattern converting section 60 converts the cumulative waveform into a clock pattern waveform. At S1608, the analytic signal generating section 30 generates the analytic signal of the cumulative waveform converted into the clock pattern. At S1610, the jitter measuring section 40 measures the jitter of the signal under measurement from the instantaneous phase of the analytic signal. With this process, the jitter calculator 10 can quickly and accurately measure the deterministic jitter of the signal under measurement.

Figure 17:
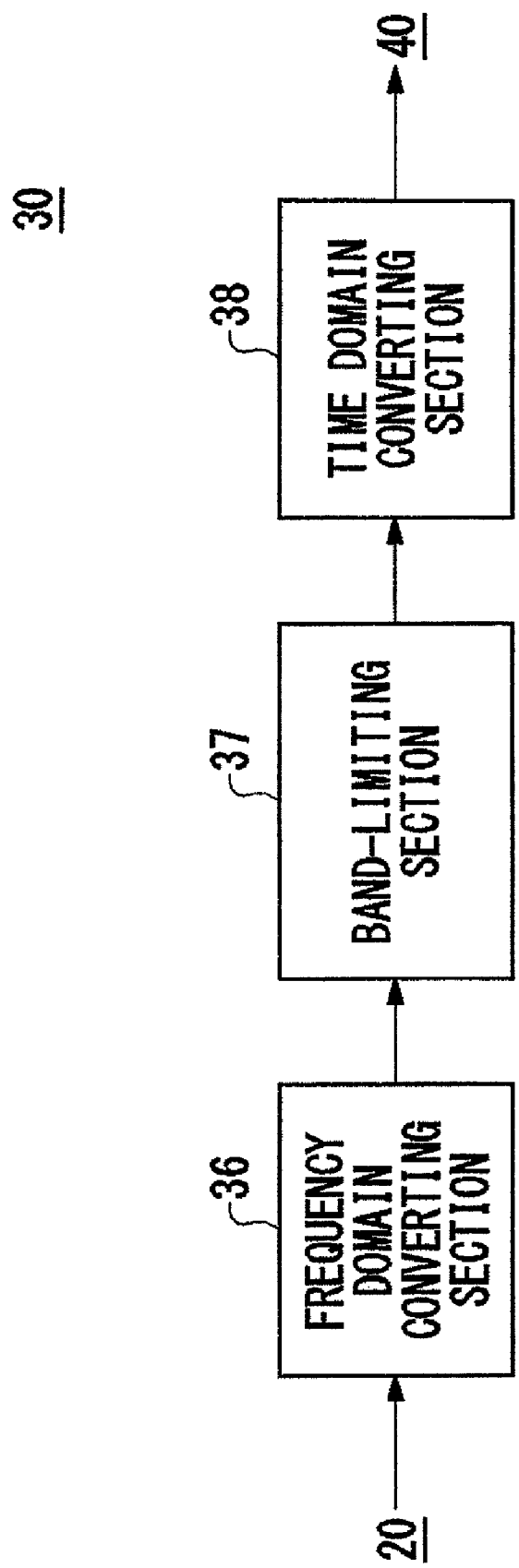
FIG. 17 shows another exemplary configuration of the analytic signal generating section 30.

FIG. 17 shows another exemplary configuration of the analytic signal generating section 30. The analytic signal generating section 30 of the present embodiment includes a frequency domain converting section 36, a band limiting section 37, and a time domain converting section 38.

The frequency domain converting section 36 converts the signal input to the analytic signal generating section 30 into a spectrum in the frequency domain. For example, the frequency domain converting section 36 performs a Fourier transform to convert the signal into a spectrum in the frequency domain.

The band limiting section 37 eliminates components outside of a prescribed band from the spectrum output by the frequency domain converting section 36, and outputs the resulting spectrum. The band limiting section 37 may eliminate frequency spectrums that are not included in a prescribed positive frequency range centered on the fundamental frequency of the signal under measurement. The prescribed positive frequency range may be a range that does not include a $2^{nd}$-order harmonic of the fundamental wave.

The time domain converting section 38 converts the spectrum passed by the band limiting section 37 into a signal in the time domain. For example, the time domain converting section 38 performs an inverse Fourier transform to convert the spectrum into the signal in the time domain. The time domain converting section 38 outputs the signal in the time domain to the jitter measuring section 40 as the analytic signal.

Figure 18:
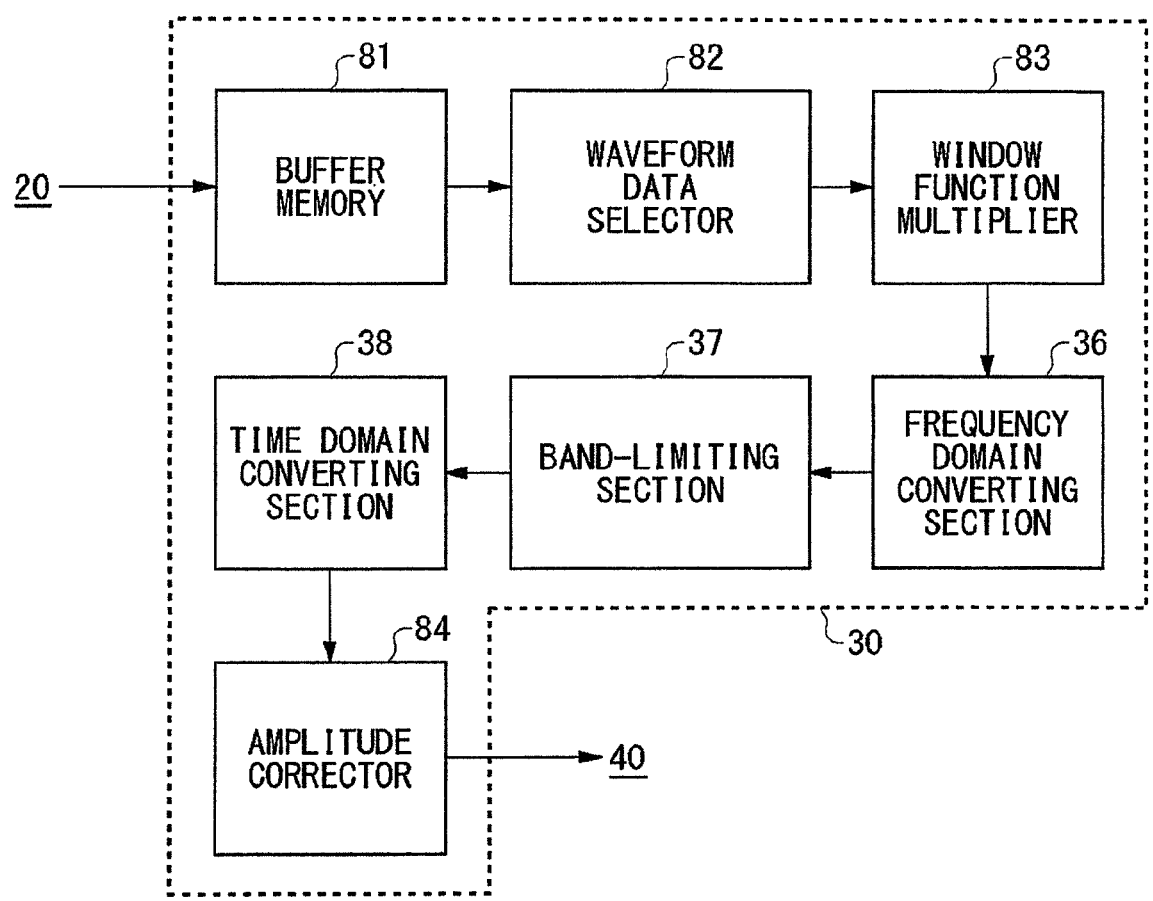
FIG. 18 shows another exemplary embodiment of the analytic signal generating section 30.

FIG. 18 shows another exemplary embodiment of the analytic signal generating section 30. The analytic signal generating section 30 of the present embodiment includes a buffer memory 81, a waveform data selecting section 82, a window function multiplier 83, the frequency domain converting section 36, the band limiting section 37, the time domain converting section 38, and an amplitude corrector 84.

The buffer memory 81 accumulates a data sequence of the reconfigured waveform output by the waveform reconfiguring section 20. The waveform data selecting section 82 extracts partial data, which is obtained by dividing the data sequence accumulated by the buffer memory 81, such that a portion of each piece of extracted partial data overlaps with the piece of partial data extracted therebefore. The window function multiplier 83 multiplies (i) each piece of partial data extracted by the waveform data selecting section 82 by (ii) a window function.

The frequency domain converting section 36 converts the pieces of partial data multiplied by the window function into a two-sided spectrum signal in the frequency domain. The band limiting section 37 acquires only the components near the fundamental frequency of the signal under measurement from the two-sided spectrum signal in the frequency domain.

The time domain converting section 38 converts the output of the band limiting section 37 into a signal in the time domain.

The amplitude corrector 84 multiplies the signal in the time domain by an inverse of the window function to obtain a band-limited analytic signal. In the above description, the frequency domain converting section 36 and the time domain converting section 38 may perform the conversions between the frequency domain and the time domain using FFTs and inverse FFTs, respectively. The amplitude corrector 84 may connect the pieces of partial data and output the resulting data sequence. At this time, the amplitude corrector 84 may connect the pieces of partial data while eliminating a portion of each piece of partial data overlapping with a previous piece of partial data.

Figure 19:
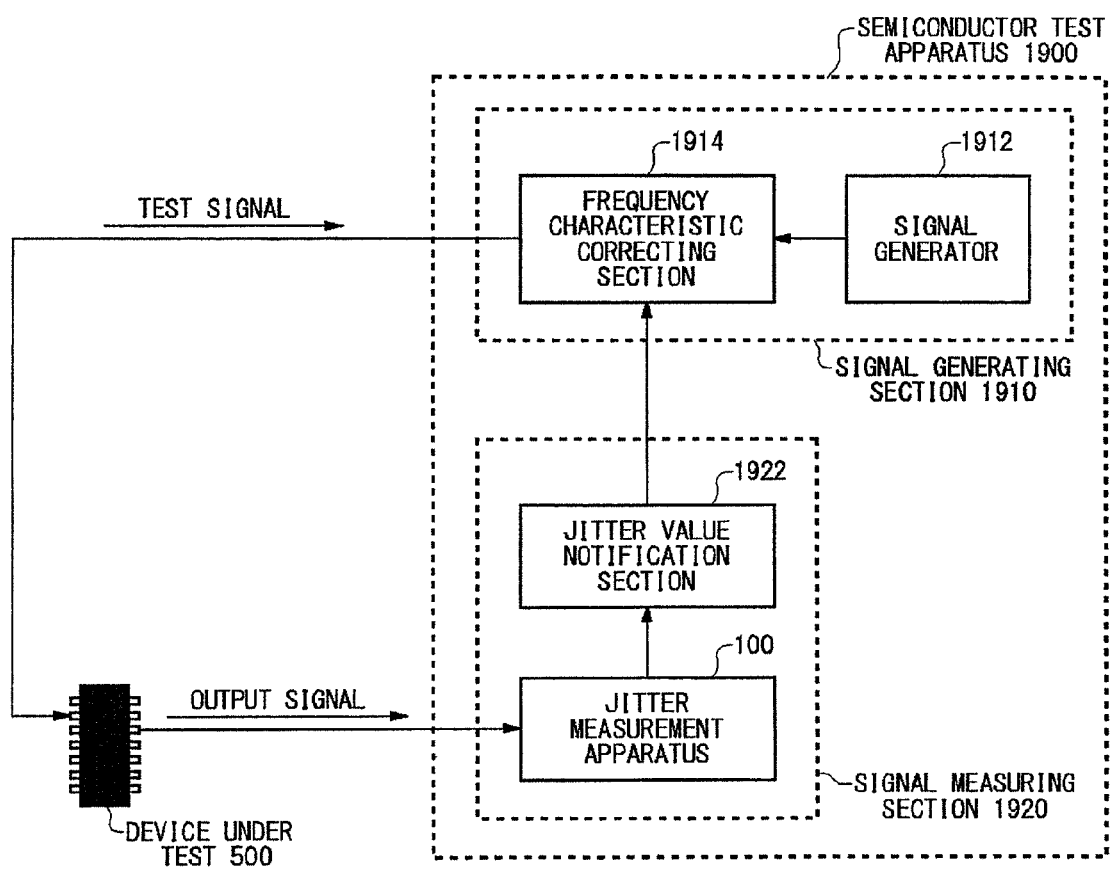
FIG. 19 is a block diagram showing an exemplary configuration of a semiconductor test apparatus 1900.

FIG. 19 is a block diagram showing an exemplary configuration of a semiconductor test apparatus 1900. The semiconductor test apparatus 1900 is an example of a test apparatus. The semiconductor test apparatus 1900 provides a test signal to a device under test 500 to test the device under test 500. The semiconductor test apparatus 1900 is provided with a signal generating section 1910 and a signal measuring section 1920. The signal generating section 1910 generates the test signal. The signal measuring section 1920 measures an output signal of the device under test 500. The output signal has a period T. The signal generating section 1910 includes a signal generator 1912 and a frequency characteristic correcting section 1914. The signal measuring section 1920 includes the jitter measurement apparatus 100 and a jitter value notification section 1922.

The signal generator 1912 generates the test signal. The frequency characteristic correcting section 1914 adjusts the frequency characteristic of the test signal to decrease the jitter value of the output signal in accordance with the jitter value of the output signal measured by the signal measuring section 1920. The frequency characteristic correcting section 1914 may adjust the frequency characteristic of the test signal according to the jitter value indicated by notification from the jitter value notification section 1922. For example, if the jitter value indicated by the notification from the jitter value notification section 1922 is greater than a prescribed value, the frequency characteristic correcting section 1914 adjusts an equalizer, not shown, to enhance the high frequency component of the test signal.

The sampling section 110 of the jitter measurement apparatus 100 samples the output signal a certain number of times N while the prescribed pattern of the output signal repeats for M cycles, where M and N are coprime. The jitter value notification section 1922 notifies the signal generating section 1910 concerning the jitter value, e.g. the RMS value, peak value, or peak-to-peak value, of the output signal measured by the jitter measurement apparatus 100.

Figure 20:
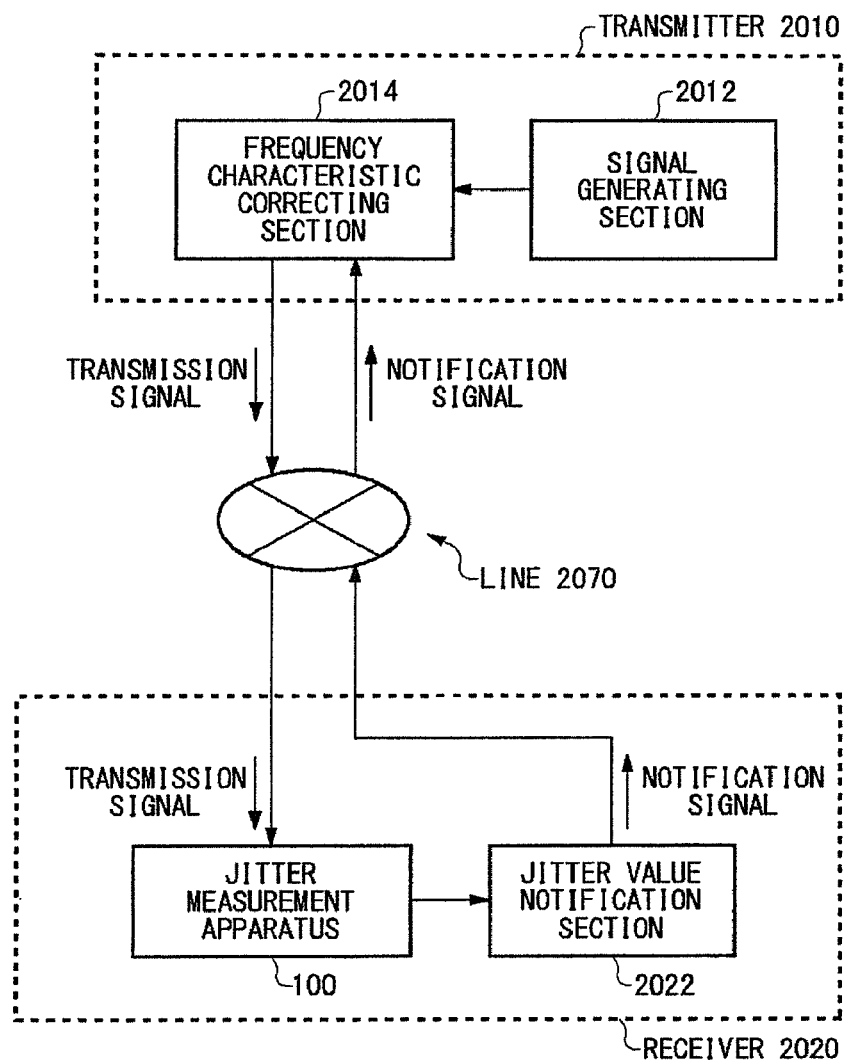
FIG. 20 is a block diagram showing an exemplary configuration of a communication system 2000.

FIG. 20 is a block diagram showing an exemplary configuration of a communication system 2000. The communication system 2000 is provided with a transmitter 2010, a receiver 2020, and a line 2070 allowing communication between the transmitter 2010 and the receiver 2020.

The transmitter 2010 generates a transmission signal. The receiver 2020 receives the transmission signal via the line 2070. The receiver 2020 sends the notification signal to the transmitter 2010 concerning via the line 2070. The transmission signal has a period T. The transmitter 2010 includes a signal generating section 2012 and a frequency characteristic correcting section 2014. The receiver 2020 includes the jitter measurement apparatus 100 and a jitter value notification section 2022.

The signal generating section 2012 generates the transmission signal. The frequency characteristic correcting section 2014 adjusts the frequency characteristic of the transmission signal to decrease the jitter value of the transmission signal in accordance with the jitter value of the transmission signal measured by the receiver 2020. The frequency characteristic correcting section 2014 may adjust the frequency characteristic of the transmission signal according to the jitter value indicated by the notification from the jitter value notification section 2022. For example, if the jitter value indicated by the notification from the jitter value notification section 2022 is greater than a prescribed value, the frequency characteristic correcting section 2014 adjusts an equalizer, not shown, to enhance the high frequency component of the transmission signal.

The sampling section 110 of the jitter measurement apparatus 100 samples the transmission signal a certain number of times N while the transmission signal repeats for M cycles, where M and N are coprime. The jitter value notification section 2022 sends the notification signal to the transmitter 2010. The jitter value notification section 2022 may notify the transmitter 2010 concerning the jitter value of the transmission signal, which is the statistical value calculated by the statistical value calculating section 146 of the jitter measurement apparatus 100.

Figure 21:
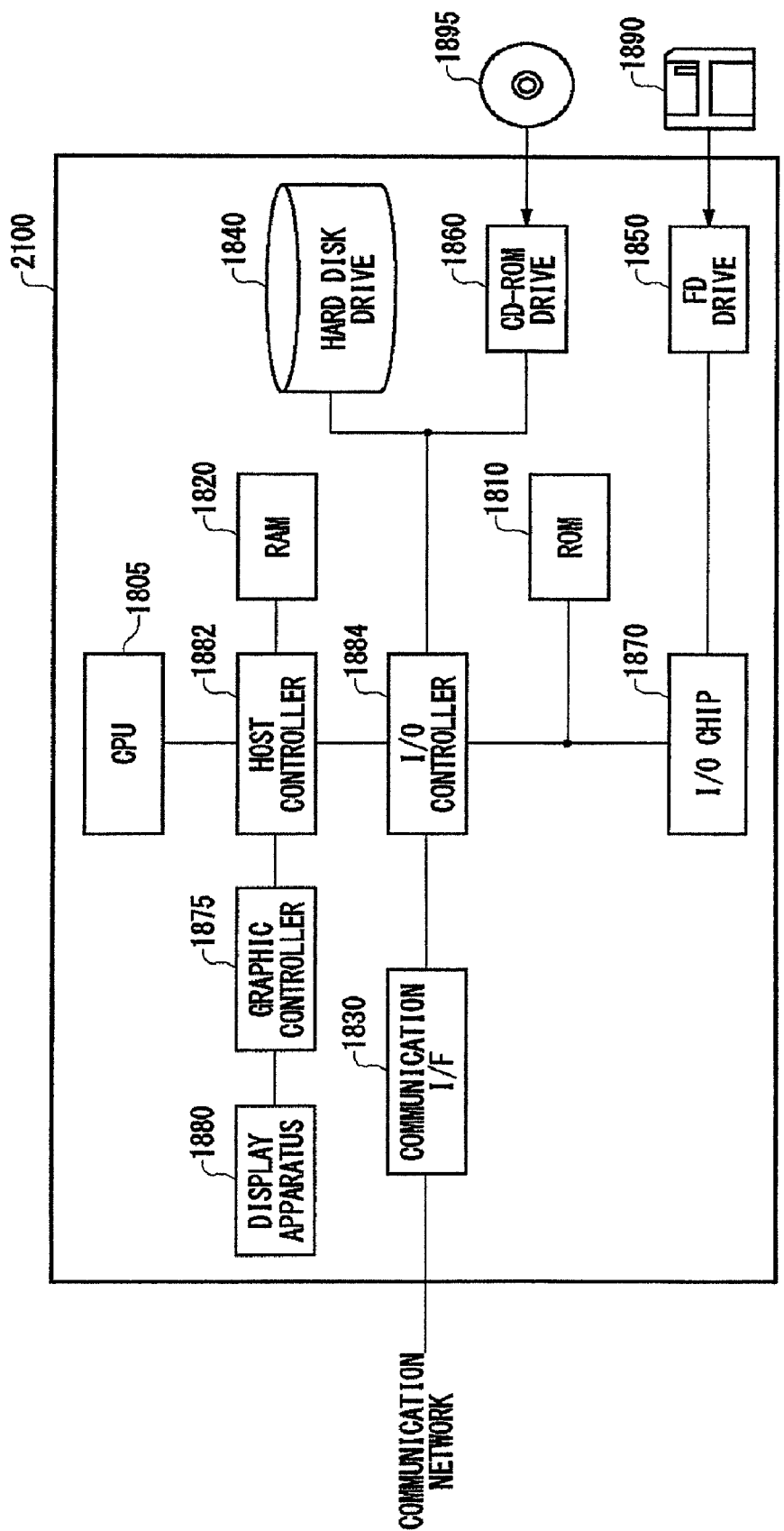
FIG. 21 shows an exemplary hardware configuration of a computer 2100 functioning as the jitter calculator apparatus 10.

FIG. 21 shows an exemplary hardware configuration of a computer 2100 functioning as the jitter calculator apparatus 10. The computer 2100 is provided with a CPU peripheral section, an input/output section, and a legacy input/output section. The CPU peripheral section includes a CPU 1805, a RAM 1820, a graphic controller 1875, and a display apparatus 1880 connected to each other by a host controller 1882.

The input/output section includes a communication interface 1830, a hard disk drive 1840, and a CD-ROM drive 1860, all of which are connected to the host controller 1882 by an input/output controller 1884. The legacy input/output section includes a ROM 1810, a flexible disk drive 1850, and an input/output chip 1870, all of which are connected to the input/output controller 1884.

The host controller 1882 is connected to the RAM 1820 and is also connected to the CPU 1805 and graphic controller 1875 accessing the RAM 1820 at a high transfer rate. The CPU 1805 operates to control each section based on programs stored in the ROM 1810 and the RAM 1820. The graphic controller 1875 acquires image data generated by the CPU 1805 or the like on a frame buffer disposed inside the RAM 1820 and displays the image data in the display apparatus 1880. Alternatively, the graphic controller 1875 may internally include the frame buffer storing the image data generated by the CPU 1805 or the like.

The input/output controller 1884 connects the hard disk drive 1840 serving as a relatively high speed input/output apparatus, the communication interface 1830, and the CD-ROM drive 1860 to the host controller 1882. The hard disk drive 1840 stores the programs and data used by the CPU 1805. The communication interface 1830 is connected to a network communication apparatus 1898 to receive the programs or the data. The CD-ROM drive 1860 reads the programs and data from a CD-ROM 1895 and provides the read information to the hard disk drive 1840 and the communication interface 1830 via the RAM 1820.

The input/output controller 1884 is connected to the ROM 1810, and is also connected to the flexible disk drive 1850 and the input/output chip 1870 serving as a relatively high speed input/output apparatus. The ROM 1810 stores a boot program performed when the jitter calculator 10 starts up, a program relying on the hardware of the jitter calculator 10, and the like. The flexible disk drive 1850 reads the programs or data from a flexible disk 1890 and supplies the read information to the hard disk drive 1840 and the communication interface 1830 via the RAM 1820. The input/output chip 1870 connects the flexible disk drive 1850 to each of the input/output apparatuses via, a parallel port, a serial port, a keyboard port, a mouse port, or the like.

The programs performed by the CPU 1805 are stored on a recording medium such as the flexible disk 1890, the CD-ROM 1895, or an IC card and are provided by the user. The programs stored on the recording medium may be compressed or uncompressed. The programs are installed on the hard disk drive 1840 from the recording medium, are read by the RAM 1820, and are performed by the CPU 1805. The programs performed by the CPU 1805 cause the computer 2100 to function as each of the elements of any one of the jitter calculators 10 described in relation to FIGS. 1 to 18.

The programs shown above may be stored in an external storage medium. In addition to the flexible disk 1890 and the CD-ROM 1895, an optical recording medium such as a DVD or PD, a magneto-optical medium such as an MD, a tape medium, a semiconductor memory such as an IC card, or the like can be used as the recording medium. Furthermore, a storage apparatus such as a hard disk or a RAM disposed in a server system connected to the Internet or a specialized communication network may be used as the storage medium and the programs may be provided to the jitter measurement apparatus 100 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

As made clear from the above, the embodiments of the present invention can be adopted to realize a jitter measurement apparatus that can quickly and accurately calculate jitter.

What is claimed is:

1. A jitter measurement apparatus that measures timing jitter of a signal under measurement having a prescribed repeating pattern, comprising:
   a sampling section that coherently samples the signal under measurement within a prescribed measurement duration;
   a waveform reconfiguring section that rearranges ordinal ranks of data values sampled by the sampling section to generate a reconfigured waveform that is a reproduction of a waveform of the signal under measurement;
   an analytic signal generating section that converts the reconfigured waveform into a complex analytic signal; and
   a jitter measuring section that measures jitter of the signal under measurement based on the analytic signal.

2. The jitter measurement apparatus according to claim 1, wherein the jitter measuring section includes:
   an instantaneous phase calculating section that calculates an instantaneous phase of the reconfigured waveform based on the analytic signal;
   a phase noise calculating section that eliminates a linear instantaneous phase component from the instantaneous phase of the reconfigured waveform to calculate an instantaneous phase noise of the reconfigured waveform; and
   a resampling section that resamples the instantaneous phase noise of the reconfigured waveform to calculate a timing jitter sequence of the reconfigured waveform.

3. The jitter measurement apparatus according to claim 2, further comprising a pattern converting section that converts the pattern of the reconfigured waveform into a clock pattern in which (i) an edge with a prescribed timing is generated for a bit boundary at which a logic value of the reconfigured waveform does not change and (ii) an edge having the same timing as a transition timing of the logic value is generated for a bit boundary at which the logic value changes, and supplies the clock pattern to the analytic signal generating section.

4. The jitter measurement apparatus according to claim 2, wherein
the signal under measurement repeats the pattern for each set of a prescribed number of bits,
the jitter measurement apparatus further comprises a cumulative waveform generating section that divides the reconfigured waveform into sections that each have an integer multiple of the prescribed number of bits, and generates a cumulative waveform by adding together partial waveforms resulting from the division of the reconfigured waveform,
the analytic signal generating section converts the cumulative waveform into the analytic signal, and
the jitter measuring section measures deterministic jitter of the signal under measurement based on the analytic signal.

5. The jitter measurement apparatus according to claim 2, wherein
the jitter measuring section calculates a jitter value of the signal under measurement based on the timing jitter sequence.

6. The jitter measurement apparatus according to claim 2, wherein
the jitter measuring section generates a histogram of jitter of the signal under measurement.

7. The jitter measurement apparatus according to claim 2, wherein
the waveform reconfiguring section rearranges a k-th data value sampled by the sampling section to be an i-th data value of the reconfigured waveform according to an expression i=kM mod N, where M represents a number of repetitions of the pattern of the signal under measurement within the measurement duration and N represents a number of samples made by the sampling section within the measurement duration.

8. A communication system comprising a transmitter and a receiver, wherein
the receiver includes the jitter measurement apparatus according to claim 1.

9. The communication system according to claim 8, wherein
the receiver further includes a jitter value notification section that notifies the transmitter concerning a jitter value of the signal under measurement measured by the jitter measuring section, and
the transmitter includes a frequency characteristic correcting section that corrects a frequency characteristic of a signal sent by the transmitter in a manner to minimize the jitter value of the signal received by the receiver, according to the jitter value notification received from the jitter value notification section.

10. A test apparatus that supplies a test signal to a device under test to test the device under test, comprising:
a signal generating section that generates the test signal; and
the jitter measurement apparatus according to claim 1 that measures jitter of an output signal from the device under test.

11. The test apparatus according to claim 10, further comprising a jitter value notification section that notifies the signal generating section concerning a jitter value of the signal under measurement measured by the jitter measuring section, wherein
the signal generating section includes a frequency characteristic correcting section that corrects a frequency characteristic of the test signal in a manner to minimize the jitter value of the output signal, according to the jitter value notification received from the jitter value notification section.

12. A jitter calculator that calculates jitter of a signal under measurement having a prescribed repeating pattern, based on sampling data obtained by coherently sampling the signal under measurement, comprising:
a waveform reconfiguring section that rearranges an ordinal rank of each data value of the sampling data to generate a reconfigured waveform that is a reproduction of a waveform of the signal under measurement;
an analytic signal generating section that converts the reconfigured waveform into a complex analytic signal; and
a jitter measuring section that measures jitter of the signal under measurement based on the analytic signal.

13. A method for measuring timing jitter of a signal under measurement having a prescribed repeating pattern, the method comprising:
coherently sampling, by a computer having a central processing unit (CPU), the signal under measurement within a prescribed measurement duration;
replacing ordinal ranks of sampled data values to generate a reconfigured waveform that is a reproduction of a waveform of the signal under measurement;
converting the reconfigured waveform into a complex analytic signal; and
measuring jitter of the signal under measurement based on the analytic signal.

14. A non-transitory recording medium storing thereon a program that causes a computer to function as a jitter calculator for calculating jitter of a signal under measurement having a prescribed repeating pattern based on sampling data obtained by coherently sampling the signal under measurement, the program causing the computer to function as:
a waveform reconfiguring section that rearranges an ordinal rank of each data value of the sampling data to generate a reconfigured waveform that is a reproduction of a waveform of the signal under measurement;
an analytical signal generating section that converts the reconfigured waveform into a complex analytic signal; and
a jitter measuring section that measures jitter of the signal under measurement based on the analytic signal.

* * * * *